United States Patent [19]

Engstrom

[11] Patent Number: 4,704,601

[45] Date of Patent: Nov. 3, 1987

[54] KEYBOARD DATA ENTRY SYSTEM WITH HYSTERESIS

[75] Inventor: Keith A. Engstrom, So. Barrington, Ill.

[73] Assignee: Illinois Tool Works Inc., Chicago, Ill.

[21] Appl. No.: 749,334

[22] Filed: Jun. 27, 1985

[51] Int. Cl.[4] .............................................. H04L 3/00
[52] U.S. Cl. ........................... 340/365 E; 340/365 R; 340/365 S
[58] Field of Search ........... 340/365 E, 365 L, 365 C, 340/365 S, 365 R, 711, 712; 400/477; 200/5 R, 159 R, 340, DIG. 25; 178/18; 179/90 K

[56] References Cited

U.S. PATENT DOCUMENTS

| | | | |
|---|---|---|---|
| 3,750,113 | 7/1973 | Cencel | 340/365 C |
| 3,918,051 | 11/1975 | Bernin et al. | 340/365 E |
| 4,037,225 | 7/1977 | DuVall | 340/365 E |
| 4,110,748 | 8/1978 | Marino | 340/365 E |
| 4,300,135 | 12/1981 | Dahl et al. | 340/365 C |
| 4,390,866 | 6/1983 | Engstrom | 340/365 E |
| 4,453,198 | 6/1984 | Bush et al. | 340/365 C |
| 4,517,553 | 5/1985 | Engstrom | 340/365 L |

FOREIGN PATENT DOCUMENTS 0011840 6/1980 European Pat. Off. ........ 340/365 E

OTHER PUBLICATIONS

Rowe, Jr.–"Dynamic Updating of Key-Sensing Thresholds"–IBM Technical Disclosure Bulletin–vol. 29, No. 4A, Sep./84–pp. 2012-2018.

Primary Examiner—John W. Caldwell, Sr.
Assistant Examiner—Mahmoud Faiahi-yar
Attorney, Agent, or Firm—D. D. Mondul; T. W. Buckman

[57] ABSTRACT

A keyboard having a plurality of selectively operable matrix element key switches, each having an actuated and an unactuated state. The state of each switch is sequentially determined by applying one of two input signals to the input of each switch. The output of the switch is integrated and compared to a predetermined value to determine whether the switch is to be recognized as actuated or not actuated. If during a particular sequence the integrated output exceeds the predetermined value (so that the switch is recognized as actuated), the second input signal is applied to the switch during the next sequence. Because the second input signal has different parameters from the first input signal, whether by a greater number of pulses or greater amplitude pulses, then if the key switch is still depressed, the integrated signal produced by the second input signal exceeds the predetermined value by a greater amount than during the prior sequence. This has the effect of eliminating false multiple key recognition caused by noise signals. In addition, it provides separate travelpoints of the key switch for recognition of actuation and release.

17 Claims, 8 Drawing Figures

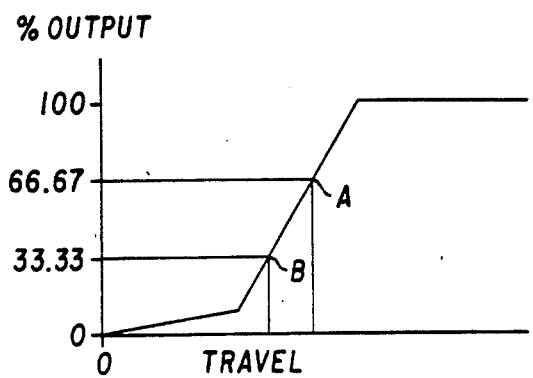
FIG. 1
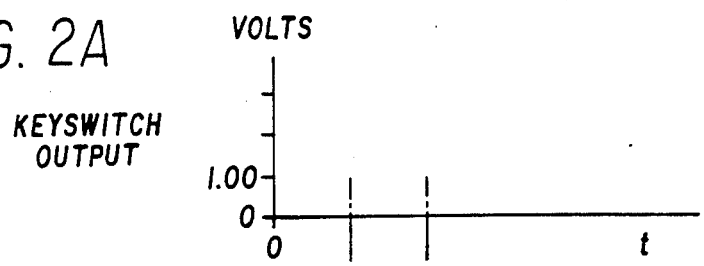
FIG. 2A
FIG. 2B
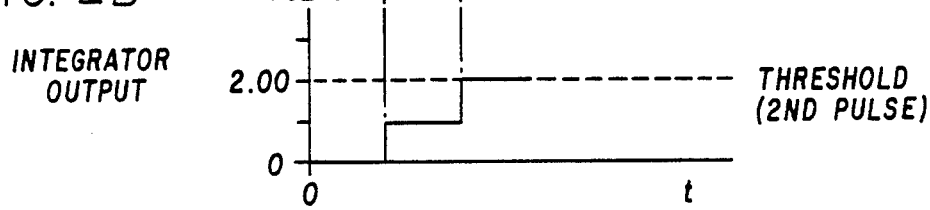
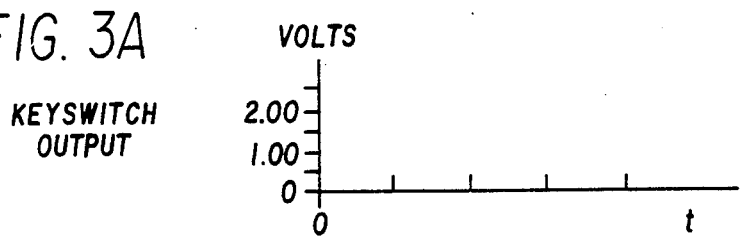
FIG. 3A
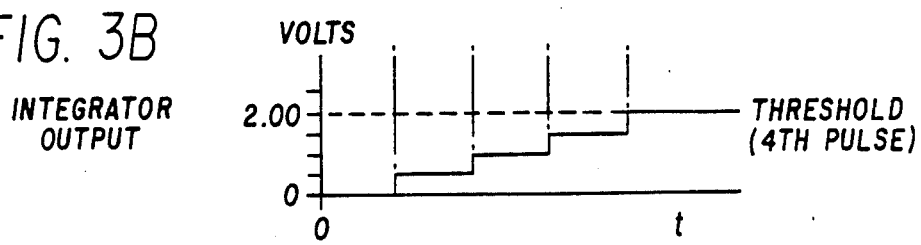
FIG. 3B

KEYBOARD DATA ENTRY SYSTEM WITH HYSTERESIS

TECHNICAL FIELD

The present invention relates to a keyboard data entry system and, more particularly, to such a system with hysteresis which allows for actuation and deactuation of a key switch to be recognized at different points of key switch travel.

BACKGROUND

Keyboards provide a well-known device for entering data into data processors or other systems requiring a means for entering data. Typical keyboards include a plurality of key switches and have a two-dimensional scanning matrix. Each cross over point in the matrix has a possibility of a corresponding key switch which may be a saturable core-type solid state analog switch. The scanning matrix includes drive lines which scan along one axis of the matrix and sense lines which scan along the other axis.

In a known prior art system as shown in U.S. Pat. No. 4,390,866, the drive lines provide a signal which is sequentially applied to the input of the key switches while a multiplexer scans the sense lines. A common counter is used to keep the multiplexer synchronized with the circuitry providing the sense line signals. The counter also provides a code assignment data for each of the key switches. The code assignment data is advanced as each of the key switches are scanned.

In this known system, when a key is actuated, a signal on the drive line is inductively coupled to the corresponding sense line. The multiplexer, in turn, applies this signal to a differential amplifier. The output of the differential amplifier is applied to a threshold detector, the output of which is coupled to other circuitry including a shift register for storing the differential amplifier output signal. The shift register provides a strobe signal to the data processor. When the strobe signal is generated, this manner, the data processor receives the code assignment data corresponding to an actuated key.

When a saturable core or another type of analog key switch, such as a capacitively coupled switch, is employed, its output signal level which is a function of the key switch position. As the key switch is depressed, the output signal level approaches the threshold level. Any mechancial or electrical noise signal present may vary the output signal above and below the threshold for a number of scanning cycles, and thus cause multiple strobing. The multiple strobing will be interpreted by the data processor as though a particular key was repeatedly actuated several times, even though the key was actuated only once.

The multiple strobing results from the fact that the point of travel of the key switch at which actuation is recognized is the same point of travel at which deactuation is recognized. This makes the output signal of the key switch particularly susceptible to noise as it approaches the actuation recognition point. This problem is further complicated by the fact that differential amplifiers and shift registers are especially susceptible to electromagnetic interference or noise.

Such a system also exhibits a lack of adaptability, in that a designer must choose the threshold value, and once chosen, this value cannot be changed. Thus, factors such as temperature and humidity cannot be taken into account. Furthermore, there is no method of compensating for key-to-key noise variations because the threshold level is the same for all keys.

SUMMARY OF THE INVENTION

In accordance with the present invention, the disadvantages of prior keyboard data entry systems have been overcome. The keyboard data entry system of the present invention utilizes a two-dimensional scanning matrix with two different drive signals being provided, depending on the state of the switch, to the inputs of the key switches by the drive lines of the matrix. The key switch input signals number of pulses, or the amplitude of the pulses, or both.

When the first input pulse train is applied to an actuated key switch, the output of the switch supplies a signal which is proportional to the input pulse train. This signal is integrated and the integrated signal is compared to a predetermined value. If the integrated signal exceeds the predetermined value, the key switch is recognized as actuated. During each scan cycle, a memory is used to store data representative of the state of each key switch. The memory is coupled to a controller which selects one of the two input pulse trains.

Once a key switch is recognized as actuated, the second input pulse train will be provided to the input of that key switch during the next scan cycle. The second input pulse train will cause the integrator to produce a higher output signal for a key switch in the same position as during the previous scan. The higher output signal will more easily exceed the predetermined value thereby eliminating false multiple key recognition caused by noise signals present in the system.

The controller can select the predetermined value against which the integrated key switch output signal is compared. By varying this predetermined value, the controller can select specific key switch actuation and deactuation recognition points. The controller can also vary the threshold level to determine the amount of noise associated with each key switch.

These and other objects and advantages of the invention, as well as details of an illustrative embodiment, will be more fully understood from the following description and the drawings.

BRIEF DESCRIPTION OF THE DRAWINGS

FIG. 1 is a graph illustrating percent of electrical output of a key switch as a function of physical travel of the key;

FIG. 2A shows the time domain output signal for an actuated key switch when the first input pulse train is applied;

FIG. 2B shows the time domain signal of FIG. 2A integrated;

FIG. 3A shows the time domain output signal for an actuated key when the second input pulse train is applied;

FIG. 3B shows the time domain signal of FIG. 3A integrated;

DESCRIPTION OF THE PREFERRED EMBODIMENT

Figure 4:
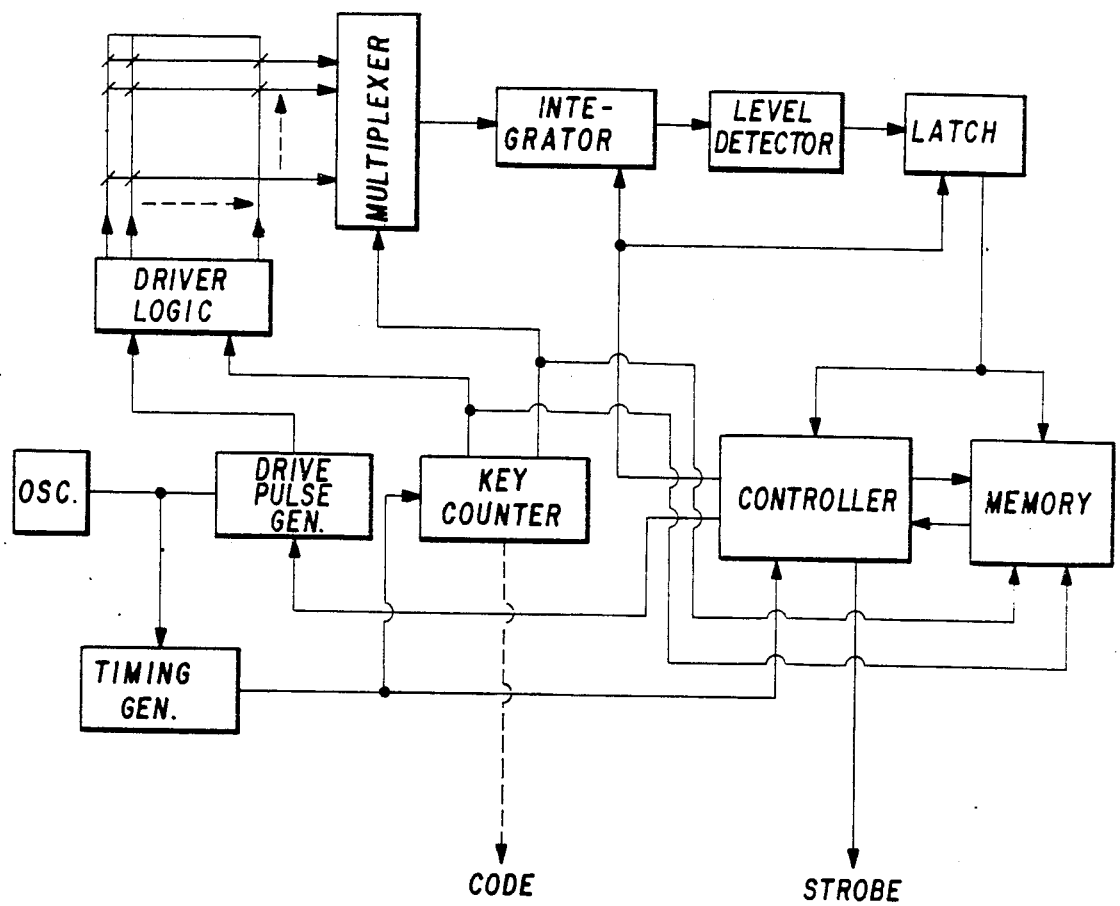
FIG. 4 is a block diagram of an illustrative embodiment according to the present invention.

In FIG. 4, a block diagram of a system according to various aspects of the present invention is shown. The system includes a two-dimensional scanning matrix 10. The matrix 10 includes a plurality of drive lines 12 arranged along one axis of the matrix, here illustrated as the vertical axis, and a plurality of sense lines 14 arranged along the other axis, here illustrated as the horizontal axis. The drive lines 12 are sequentially provided with signals from a driver logic circuit 16, while the sense lines 14 are scanned by a multiplexer 18. Timing signals for both the driver logic 16 and the multiplexer 18 are provided by a key counter 20 via buses 9 and 11, respectively.

A typical matrix 10 would have sixteen drive lines and eight sense lines providing 128 cross over points in the matrix. Each cross over point in the matrix may have a corresponding key switch associated with it. Each of the possible 128 key switches is assigned a particular seven binary address.

The key counter 20 provides the seven bit binary address to address each of the key switches. The four least significant bits from key counter 20 are applied to the input of the driver logic 16 by the bus 9. Each of the sixteen possible states of the four bit address corresponds to a particular drive line 12. The three most significant bits from key counter 20 are applied to the input of the multiplexer 18 by the bus 11. Each of the eight possible states of three bit address corresponds to a particular sense line 14.

Figure 6:
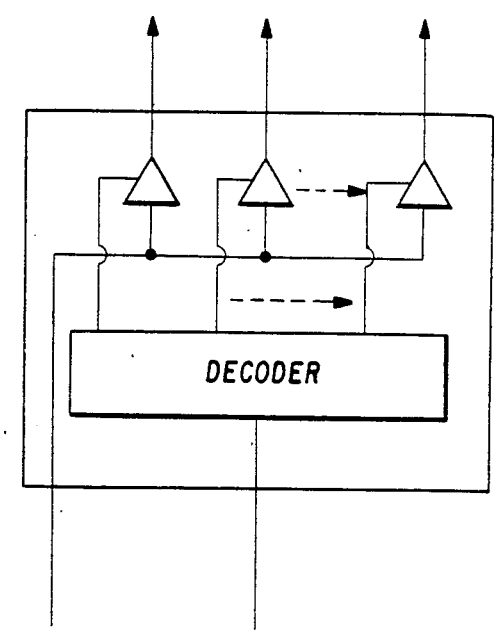
FIG. 6 is a schematic diagram of the driver logic.

Referring to FIG. 6, illustrative driver logic is shown in more detail. The driver logic 16 includes a one of sixteen decoder 8 to which the bus 9 transmits the four bit address from the key counter 20. Each of the sixteen output lines 15 from the decoder is applied to a gate control 17 of a respective line driver amplifier 26. The inputs to the line amplifiers are commonly connected to the output line 13 of a drive pulse generator 22. A particular four bit address on the bus 9 will cause one and only one of the line drive amplifiers 26 to be enabled. The enabled amplifier will allow the signal on the input line 13 to appear on the corresponding drive line 12. The remaining drive lines will have no signal since their corresponding line amplifiers are disabled. As the address from the key counter advances, each of the sixteen drive lines is in turn provided with the signal supplied by the pulse generator 22.

Referring again to FIG. 4, the key counter 20 receives a clock input from a timing generator 30. The timing generator 30 receives its clock input from an oscillator 28. The key counter typically operates at a frequency in the range of 2 kHZ to 10 kHZ. Assuming the clock frequency of the key counter is 10 kHZ, then the key counter provides a new seven bit address every 100 microseconds. The drive pulse generator 22 is thus gated to each of the sixteen drive lines 12 for 100 microseconds before the next drive line is selected. The multiplexer 18 reads each sense line 14 for a period of 1.6 milliseconds before advancing to the next sense line. The multiplexer will thus advance one position for each sixteen scans of the driver logic.

It should be noted that each of the 128 matrix cross over points has a 100 microseconds time slot during which it is both driven by the driver logic and read by the multiplexer. An entire cycle will be completed, i.e., each cross over point in the matrix will be selected, every 12.8 milliseconds.

Figure 5:
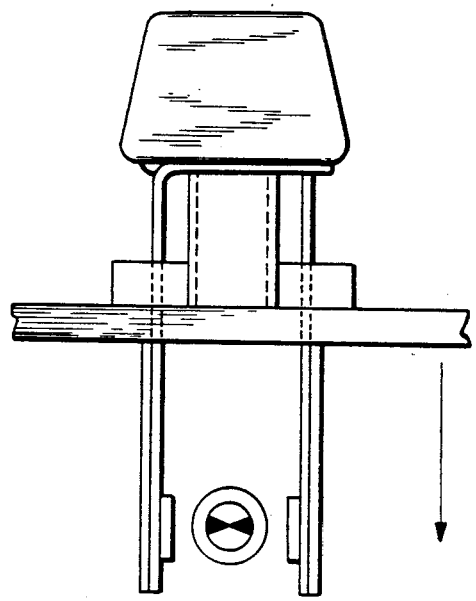
FIG. 5 is an elevational view of a key switch connected to the sense and drive lines.

As shown in FIG. 5, each selected crossover between a drive line 12 and a sense line 14 is threaded through a toroidal ferrite core 32. An inverted U-shaped steel or other magnetic member 34 has depending legs 36 and 38 respectively carrying magnets 40 and 42 which are magnetized in opposition to one another. Thus, for example, the magnet 40 may have a north pole at its left face as viewed in FIG. 5 and a south pole at the right face confronting the ferrite core 32. Similarly, the magnet 42 has a north pole confronting the core 32 and a south pole at the remote face. The depending legs 36 and 38 and the interconnecting bight 44 of the inverted U-shaped member complete the magnetic circuit. The bight 44 of the U-shaped member is secured beneath a non-magnetic finger-operated push button 46, which can be made of plastic. A central structure 48 beneath the push button is provided with a spring restoring means (not shown) for holding the button in a normally raised position above a flange 50. A common plate for the entire keyboard can be provided to support the flange 50.

The magnets 40 and 42 normally hold the toroidal core 32 in magnetic stauration, and therefore no signal can be induced from the drive line 12 to the sense line 14. However, when the push button is depressed, the magnets move away from the toroidal core in the direction of the arrow. This causes the core 32 to come out of magnetic saturation, whereby a signal on the drive line 12 will be inductively coupled to the sense line 14 threaded through the toroidal core 32.

FIG. 1 shows the percent output of an analog key switch as function of physical travel of the key switch. The output of an analog key switch can usually be divided into three regions: a pretravel region 2, an active region 4 and an overtravel region 6. The slope and length of each line can vary to the point where a straight line is formed. Typically, a single switching point is selected as midway through the active region 4. In the present invention, however, two switching points are selected. These two points are shown in FIG. 1 as points A and B. Point A represents the actuation recognition point and, in this example, corresponds to the amount of travel of the key switch which will produce an output signal equal to 66.67% of the input signal. Point B represents the deactuation recognition point and, in this example, corresponds to the amount of travel of the key switch which will produce an output signal equal to 33.33% of the input signal. As can be seen, recognition of actuation occurs at a greater point of travel of the key switch than does recognition of deactuation.

Referring again to FIG. 4 the drive pulse generator 22 provides one of two different signals to the driver logic 16 depending on the state of the signal on a line 86 received from a controller 60. The first signal provided by the driver logic is, for example, a pulse train consisting of two 1 volt pulses, while the second signal is illustratively a pulse train consisting of four 1 volt pulses. Whether the first or second signal is provided depends on whether a key switch was previously recognized as actuated as will be described in more detail below. For a key switch previously recognized as unactuated, the controller 60 instructs the drive pulse generator 22 to provide two 1 volt pulses within the 100 microseconds time periods mentioned previously. Each of the equal width pulses in either of the pulse trains is of small enough time duration so that the entire train fits easily within the 100 microseconds time period. During the remainder of the 100 microseconds period, the output of the drive pulse generator 22 is zero.

If a particular key switch has been depressed so that it is actuated, the pulse train provided on a drive line 12 by the pulse generator 22 will be inductively coupled by the actuated key switch to the corresponding sense line 14. The signal on the sense line 14 is sent through the multiplexer 18 to an integrator 62 via a line 24. The integrator 62 integrates this signal and provides an output signal proportional to the product of the amplitude and number of pulses. Of course, if in a particular time slot there are no pulses, the integrator 62 will, ignoring noise signals, produce a zero output.

The integrated switch output signal is applied by a line 64 to a level detector 66. The level detector 66 compares the integrator output with a predetermined value. If the integrator output exceeds the predetermined value, the level detector 66 provides an output signal to latch 70 via a line 68. It will be recognized that such an output signal is provided only when the key switch in that corresponding time slot is actuated.

The latch 70 provides a suitable analog to digital interface and also lessens the timing constraints of the system. The output of the latch 70 is coupled by a line 72 to the controller 60 and a memory 74. The memory 74 contains as many storage elements as there are key switches, in this example, 128. The memory 74 is preferably a random access memory (RAM), but could also consist of individual latches or the like. The outputs from the key counter 20 are coupled by buses 76 and 78 to the memory 74. These busses provide the seven bit binary address to address the 128 storage elements of the memory in synchronism with the corresponding key switch.

If the latch 70 is set by an output signal from the level detector 66 during a particular time slot, the corresponding storage element will have a logical "1" written into it. The controller 60 provides the memory 74 with the appropriate read/write signal via a line 80 and the memory provides the stored data to the controller on a line 84. The controller also provides a reset line 82 to reset the integrator 62 and latch 70 before the start of the next 100 microsecond time slot for scanning of the next key.

The timing signals for the controller 60 originate in the timing generator 30 and are provided to the controller on a line 88. The controller can provide read/write signals to the memory 74 and reset signals to the latch 70 and integrator 62 in synchronization with the key counter 20 since the key counter clock signal also originates from the timing generator 30.

When the system detects that a key has been actuated, the controller will apply a pulse to a strobe line 56. The strobe pulse signals the device communicating with the keyboard to read the key code on a bus 58. By checking the contents of the memory, the controller will generate only one strobe pulse for a given key depression.

The controller 60 is, for example, a 8048 microprocessor made by Intel Corporation. However, discrete could also be used to provide the control functions.

The controller 60 and memory 74 provide the hysteresis scheme of the present invention by controlling the output of the drive pulse generator 22. The controller 60 is coupled to pulse generator 22 by the line 86. Upon power being applied to the system, all counters and memory devices are set to logic "0". Assume that the drive pulse generator 22 will provide an output pulse train consisting of two pulses. As mentioned previously, each of the pulses must be of small enough time duration such that entire pulse train is less than the 100 microseconds time period during which each key is addressed. The amplitude of the pulses is sufficient to produce 1 volt pulses at the output of a key switch when the key switch is depressed to the actuation point.

Referring to FIG. 1, the actuation point A of that particular key switch was selected to be at 66.67% of total output. Thus, a 1.5 volt pulse from the pulse generator would provide a 1 volt pulse from the key switch when the key switch is depressed to the actuation point. The two 1 volt pulses, see FIG. 2A, from the key switch would appear during the time slot corresponding to the actuated key. These two 1 volt pulses are integrated by the integrator 62 which provides the output signal shown in FIG. 2B.

Referring now to FIG. 4, if the predetermined value of the level detector 66 is set at 2 volts, the level detector will provide a signal which sets the latch 70 and a logical "1" will be written into the memory location corresponding to the actuated key. The fact that a particular key was recognized as actuated is communicated from the memory 74 to the controller 60. Having received this information, the controller, during the next scan cycle, will instruct the drive pulse generator 22 to provide not two, but four 1.5 volt pulses for that particular key's time slot. If the previously actuated key switch is still at actuation point A, four 1 volt pulses will be applied to the integrator. The output from the integrator will be 4 volts which amply exceeds the 2 volt threshold level, and the key will continue to be recognized as actuated.

If the key switch has been released to point B in FIG. 1, four 0.5 volt pulses (1.5 volt into key switch×33% output) will be provided at the key switch output, see FIG. 3A. (FIGS. 2A and 2B correspond to point A in FIG. 1 and FIGS. 3A and 3B correspond to point B in FIG. 1.) These four 0.5 volt pulses will be integrated by the integrator 62 and the output of the integrator will, on the application of the fourth pulse, provide a 2 volt signal which is still sufficient to trigger the level detector, see FIG. 3B. The key will thus again be recognized as actuated. However, if the key switch is released to a point under point B in FIG. 1 (i.e. closer to the origin of FIG. 1), the output from the integrator will be too small to trigger level detector 66, and as a result the key will be no longer recognized as being in the actuated state. Accordingly, a logical "0" will be written into the memory location corresponding to that key switch. During the next scan cycle two 1.5 volt pulses will again be provided by the pulse generator during the time slot for that key.

By having the drive pulse generator provide a signal having a first number of pulses to the input of a key switch previously recognized as unactuated and a signal having a second, greater number of pulses to the input of a key switch previously recognized as actuated, false multiple strobing is effectively eliminated. Multiple strobing occurs as a result of noise components being added to the various signals so that the input to the level detector will vary above and below the threshold level for a number of scanning cycles. With the hysteresis system described herein, however, after a key is first recognized as actuated, the drive pulse generator will supply a signal to the input of the key switches which will cause the integrator to provide an output signal well above the threshold level. Therefore, noise signals have no effect on triggering the level detector. Furthermore, since the memory 74 keeps track of whether each key has been actuated in the previous scan cycle, the hysteresis is applied only to actuated switches.

In the hysteresis system explained here the controller 60 controls the number of pulses generated by the drive pulse generator during a particular key's time slot. Several methods of accomplishing this are known. For example, the pulse generator could be capable of generating two different pulse trains—one pulse train having two pulses and a second having four pulses. In such case, the line 86 from the controller 60 to the pulse generator 22 would simply be a select line which, if equal to a logical "0", would select the first pulse train and, if equal to a logical "1", would select the second pulse train. Alternatively, the pulse generator could be capable of generating only a continuing series of pulses in which case line 86 could provide a control signal which would be ANDed with the pulse train. Finally, the pulse generator could comprise a presetable divided by N counter and the line 86 could be a bus which supplies the counter with a digital number to be loaded into the counter.

Rather than providing two different numbers of pulses in the pulse train, the pulse generator could generate an equal number of pulses at differing amplitudes. For example, the first signal from the pulse generator could consist of two 1.5 volt pulses as previously explained, while the second signal from the pulse generator could consist of two 0.75 volt pulses.

Regardless of how the pulse trains differ from one another, it will be appreciated that both the number and amplitude of the pulse could be determined by the controller. The values previously given were merely examples and both the number and amplitude of the pulses could be varied so long as the integrated switch output signal is different for the respective pulse trains. It will also be appreciated that the threshold value of the level detector was arbitarily selected to be 2 volts.

In order to enhance the flexibility of the system, it is desirable to have a variable threshold value. In FIG. 4, a line 90 provides the level detector 66 with a voltage signal from the controller 60. With the threshold value of the system being controlled by the controller, the system can compensate for noise signals and other system variations.

For example, one of the keyboard switches could serve as a reference key by being continually maintained in its fully actuated position. For a given threshold value, the controller would then determine how many pulses from the pulse generator were provided before the key was determined to be actuated. From this information, the controller could select the number of pulses at which actuation and deactuation are to be recognized. The controller would then provide the level detector with the threshold value corresponding to the selected actuation and deactuation points. In this manner, the system can continually compensate for temperature and humidity effects upon the circuitry. An automatic and systematic means of compensating for device-to-device variations is also provided by this method.

Besides the reference key scheme, the individual key switches could be polled to determine the amount of noise associated with each key. It will be appreciated that even if a key switch is not actuated, the noise present during a particular key switch's time slot will be integrated. If the threshold value provided by the controller is set low enough, the key will be recognized as actuated even though it is not. The controller can thus establish the actual noise signal associated with each key switch by determining the threshold value needed to recognize an unactuated key switch as actuated. In this manner, the controller can compensate for key-to-key noise variations by providing appropriate threshold levels.

The specific example of the invention is herein shown and described as for illustrative purposes only. Various changes will no doubt occur to those skilled in the art, and will be understood as forming a part of the present invention insofar as they fall within the spirit and scope of the appended claims.

What is claimed is:

1. In a data entry system having at least one switch, said at least one switch having an input and an output and having an actuated state and an unactuated state, a hysteresis system comprising:

a driver circuit coupled to the input of each of said at least one switch for cyclically providing selectively either a first drive signal or a second drive signal to said input;

an integrator coupled to the output of each of said at least one switch for providing an integrated switch output signal for each of said at least one switch;

a detector coupled to said integrator for comparing the integrated switch output signal for each of said at least one switch with a predetermined value to determine the state of each of said at least one switch; and means responsive to said detector for storing the state of each of said at least one switch during a first cycle and for controlling said driver circuit to provide the first drive signal to the input of said at least one switch during a second cycle subsequent to said first cycle if the at least one switch was determined to be in the unactuated state during said first cycle and to provide the second drive signal to the input of the at least one switch during said second cycle if the at least one switch was determined to be in the actuated state during said first cycle.

2. In a keyboard data entry system having a plurality of selectively operable matrix element switches each having an input and an output and each having an actuated state and an unactuated state, a hysteresis system comprising:

a driver circuit coupled to the inputs of each of said plurality of switches for providing selectively either a first drive signal or a second drive signal to each of the switch inputs;

an integrator coupled to the outputs of said plurality of switches for providing an integrated switch output signal for each of said plurality of switches separately;

a detector coupled to said integrator for comparing the integrated switch output signal for each of said plurality of switches with a predetermined value to determine whether each of said plurality of switches is in the actuated state or the unactuated state; and means responsive to said detector for storing the state of each of said plurality of switches during a first cycle and for controlling said driver circuit to provide the first drive signal to the inputs of each of the plurality of switches during a second cycle subsequent to said first cycle determined to be in the unactuated state during said first cycle and to provide the second drive signal to the inputs of the plurality of switches during said second cycle determined to be in the actuated state during said first cycle.

3. The data entry system as claimed in claims 1 or 2 wherein the first drive signal corresponding to the unactuated state comprises a first number of pulses and the second drive signal corresponding to the actuated state comprises a second number of pulses.

4. The date entry system as claimed in claim 3 wherein the number of pulses in the first drive signal is less than the number of pulses in the second drive signal.

5. The data entry system as claimed in claims 1 or 2 wherein said predetermined value is variable and controlled by said means responsive to said detector.

6. The data entry system as claimed in claim 2 wherein said predetermined value is varied to determine the noise signal level associated with each of said plurality of switches.

7. The data entry system as claimed in claim 2 wherein said predetermined value is selected in response to one of said plurality of switches being continually maintained in the actuated state.

8. A data entry system comprising: pulse generating means for providing either a first pulse train or a second pulse train;
  a plurality of key switch elements, each of said plurality of key switch elements having an actuated state and unactuated state, each of said plurality of key switch elements being adapted to transmit pulses applied thereto when in the actuated state;
  input addressing means coupled to each of said plurality of key switch elements and said pulse generating means for applying either the first pulse train or the second pulse train to each of said plurality of key switch elements;
  multiplexer means coupled to said plurality of key switch elements for sequentially transmitting signals from the plurality of key switch elements;
  integrator means coupled to said multiplexer means for providing an integrated value for the signals transmitted by said multiplexer;
  detector means coupled to said integrator means for determining the state of each of said plurality of key switch elements by comparing the integrated value with a predetermined value;
  memory means coupled to said detector means for storing data representing the state of each of said plurality of key switch elements; and
  means for controlling said pulse generating means to provide either the first or the second pulse train to each of said plurality of key switch elements depending on the stored state of each of said plurality of key switch elements.

9. The data entry system as claimed in claim 8 wherein said multiplexer means operates in synchronism with said input addressing means.

10. The data entry system as claimed in claim 8 wherein said memory means operates in synchronism with said input addressing means.

11. The data entry system as claimed in claim 8 wherein said system further comprises key counter means coupled to said pulse generating means for sequentially and cyclically applying the pulse trains to said switch elements.

12. The data entry system as claimed in claim 11 wherein said key counter means in combination with said control means provide signals indicating which of said switch elements is in the actuated state.

13. The data entry system as claimed in claim 8 wherein the first pulse train consists of a first number of pulses and the second pulse train consists of a second number of pulses.

14. The data entry system as claimed in claim 13 wherein the number of pulses in the first pulse train is less than the number of pulses in the second pulse train.

15. The data entry system as claimed in claim 8 wherein the predetermined value is variable and controlled by said means for controlling said pulse generating means.

16. The data entry system as claimed in claim 15 wherein the predetermined value is varied to determine the noise signal level associated with each of said switch elements.

17. The data entry system as claimed in claim 15 wherein the predetermined value is selected in response to one of said switch elements being continually maintained in the actuated state.

* * * * *